US006570157B1

United States Patent
Singh et al.

(10) Patent No.: US 6,570,157 B1
(45) Date of Patent: May 27, 2003

(54) MULTI-PITCH AND LINE CALIBRATION FOR MASK AND WAFER CD-SEM SYSTEM

(75) Inventors: Bhanwar Singh, Morgan Hill, CA (US); Khoi Phan, San Jose, CA (US); Bharath Rangarajan, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 154 days.

(21) Appl. No.: 09/591,012

(22) Filed: Jun. 9, 2000

(51) Int. Cl.[7] ............................................... G01D 18/00
(52) U.S. Cl. ........................ 250/311; 250/306; 250/307; 250/310; 250/252.1
(58) Field of Search ................................. 250/306, 307, 250/310, 311, 252.1

(56) References Cited

U.S. PATENT DOCUMENTS

| 4,139,933 A | 2/1979 | Ballard et al. |
| 4,766,311 A | 8/1988 | Seiler et al. |
| 4,818,873 A | 4/1989 | Herriot |
| 5,155,359 A | 10/1992 | Monahan |
| 5,521,516 A | * 5/1996 | Hanagama et al. ......... 324/751 |
| 5,804,460 A | * 9/1998 | Bindell et al. ............... 438/16 |
| 5,945,833 A | * 8/1999 | Mil'shtein et al. .......... 324/751 |

* cited by examiner

*Primary Examiner*—John R. Lee
*Assistant Examiner*—David A. Vanore
(74) *Attorney, Agent, or Firm*—Amin & Turocy, LLP

(57) ABSTRACT

The present invention relates to a system and method for calibrating a scanning electron microscope (SEM). The method comprises using a reference having multiple features of different dimensions and spatial interrelationships, wherein more than one feature dimension or spacing is measured using the SEM prior to measuring a workpiece. The dimensional and/or spatial measurements from the reference sample are correlated to obtain one or more calibration factors for the SEM. The calibration factor or factors may then be correlated with a workpiece SEM measurement to obtain a workpiece critical dimension (CD). A system is provided for calibrating a SEM including a reference with various measurable features of different dimensions and/or spacing. The system comprises an SEM to measure one or more reference sample feature dimensions and/or spacings and a processor or other device to correlate the measurement data to obtain one or more calibration factors.

20 Claims, 15 Drawing Sheets

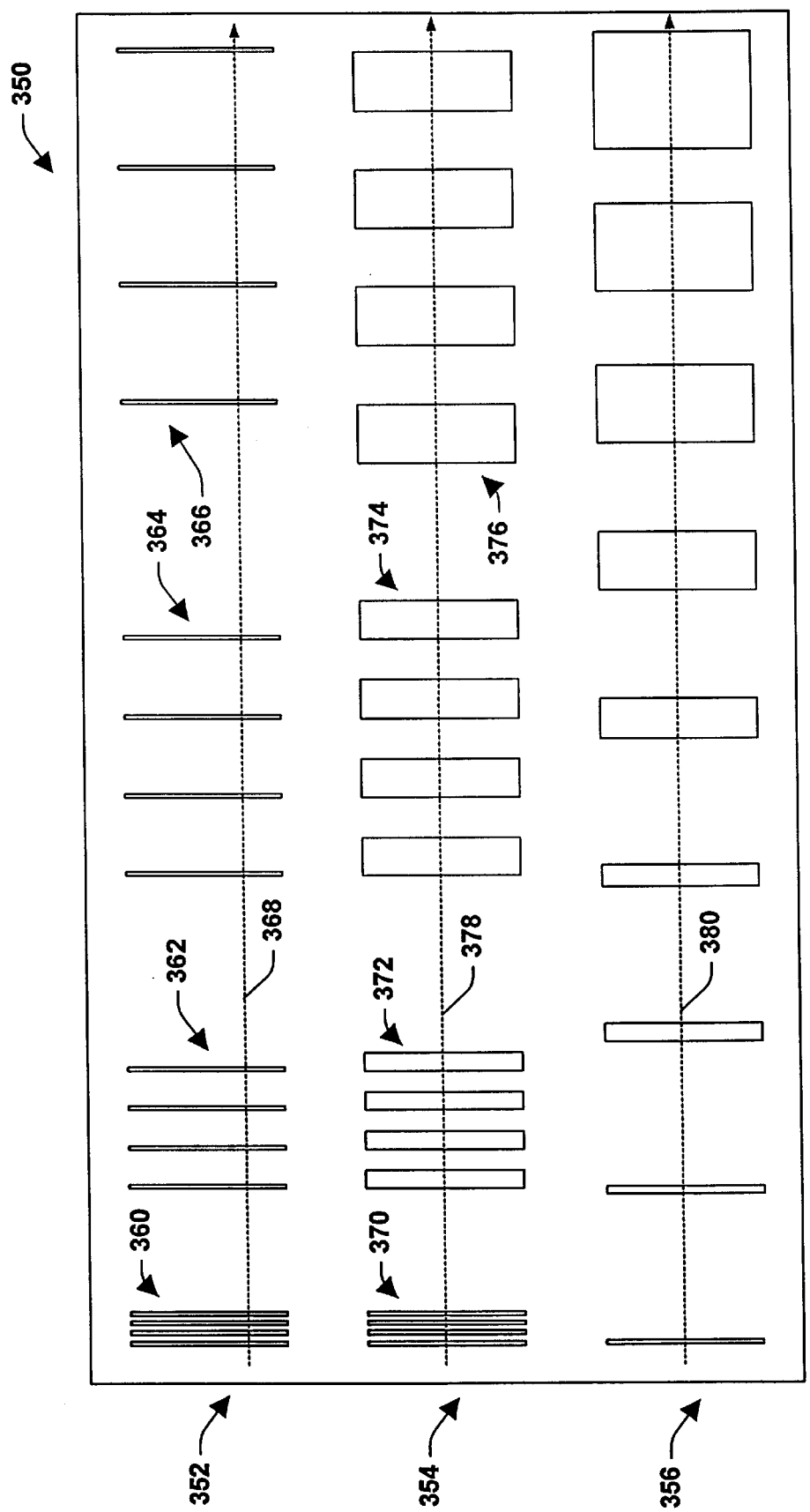

MULTI-PITCH AND LINE CALIBRATION FOR MASK AND WAFER CD-SEM SYSTEM

TECHNICAL FIELD

The present invention generally relates to measurement systems and methods and, more particularly, to a system and method for calibrating a scanning electron microscope.

BACKGROUND OF THE INVENTION

In the semiconductor industry there is a continuing trend toward higher device densities. To achieve these high densities there have been, and continue to be, efforts toward scaling down the device dimensions on semiconductor wafers. In order to accomplish such a high device packing density, smaller features sizes are required. This may include the width and spacing of interconnecting lines and the surface geometry such as the corners and edges of various features.

The requirement of small features with close spacing between adjacent features requires high resolution photo lithographic processes as well as high resolution inspection and measurement systems and/or methods. In general, lithography refers to processes for pattern transfer between various media. It is a technique used for integrated circuit fabrication in which, for example, a silicon wafer is coated uniformly with a radiation-sensitive film (e.g., a photoresist), and an exposing source (such as ultraviolet light, x-rays, or an electron beam) illuminates selected areas of the film surface through an intervening master template (e.g., a mask or reticle) to generate a particular pattern. The exposed pattern on the photoresist film is then developed with a solvent called a developer which makes the exposed pattern either soluble or insoluble depending on the type of photoresist (i.e., positive or negative resist). The soluble portions of the resist are then removed, thus leaving a photoresist mask corresponding to the desired pattern on the silicon wafer for further processing.

In order to control quality in the design and manufacture of high density semiconductor devices, it is necessary to measure critical dimensions (CDs) associated therewith. Semiconductor device features having CDs of interest include, for example, the width of a patterned line, the distance between two lines or devices, and the size of a contact. CDs related to these and other features may be monitored during production and development in order to maintain proper device performance. As device density increases and device sizes decrease, the ability to carry out quick, inexpensive, reliable, accurate, high-resolution, non-destructive measurements of CDs in the semiconductor industry is crucial. The ability to accurately measure particular features of a semiconductor workpiece allows for adjustment of manufacturing processes and design modifications in order to produce better products, reduce defects, etc.

CDs are usually measured during or after lithography. Various operations performed during the lithography process may affect the critical dimensions of a semiconductor device. For example, variations in the thickness of the applied photoresist, lamp intensity during the exposure process, and developer concentration all result in variations of semiconductor line widths. In addition, line width variations may occur whenever a line is in the vicinity of a step (a sudden increase in topography). Such topography-related line width variations may be caused by various factors including differences in the energy transferred to the photoresist at different photoresist thicknesses, light scattering at the edges of the steps, and standing wave effects. Moreover, issues in connection with mask surface flatness, edge roughness of resist lines, charging of quartz material, chrome etch roughness, and phase shifts also factor into critical dimensions. Since these factors can greatly affect CDs, fast and reliable monitoring of semiconductor device features is important in order to guarantee acceptable device performance.

Different technologies are currently available to measure CDs associated with semiconductor devices. These include: optical microscopy, stylus profilometry, atomic force microscopy, scanning tunneling microscopy, and scanning electron microscopy. Scanning electron microscopes (SEMs) are commonly used for inspection and metrology in semiconductor manufacturing. The short wavelengths of scanning electron microscopes have several advantages over conventionally used optical microscopes. For example, scanning electron microscopes may achieve resolutions from about 100 to 200 Angstroms, while the resolution of optical microscopes is typically about 2,500 Angstroms. In addition, scanning electron microscopes provide depths of field several orders of magnitude greater than optical microscopes.

In a typical SEM wafer inspection system, a focused electron beam is scanned from point to point on a specimen surface in a rectangular raster pattern. Accelerating voltage, beam current and spot diameter may be optimized according to specific applications and specimen compositions. As the scanning electron beam contacts the surface of a specimen, secondary electrons are emitted from the specimen surface. Semiconductor inspection, analysis and metrology is performed by detecting these secondary electrons. A point by point visual representation of the specimen may be obtained on a CRT screen or other display device as the electron beam controllably scans a specimen.

Scanning electron microscopes (SEMs) operate by creating a beam of electrons accelerated to energies up to several thousand electron volts. The electron beam is focused to a small diameter and scanned across a CD or feature of interest in the scanned specimen. When the electron beam strikes the surface of the specimen, low energy secondary electrons (SEs) are emitted. The yield of secondary electrons depends on various factors including the work function of the material, the topography of the sample, the curvature of the surface, and the like. These electrons can be employed to distinguish between different materials on a specimen surface since different materials may have significantly different work functions.

Topographic features also affect the yield of electrons. Consequently, changes in height along a specimen surface may be measured using an SEM. Electron current resulting from the surface-emitted secondary electrons is detected and used to control the intensity of pixels on a monitor or other display device connected to the SEM. An image of the specimen may be created by synchronously scanning the electron beam and the display device.

Although SEMs can achieve resolution in the range of angstroms, calibration is difficult. For example, the magnification of an SEM may be calibrated by placing a sample of known dimensions, such as a chip or wafer having a conductor line of known width, in the instrument and measuring the line width of the sample. The magnification of the SEM is determined by dividing the SEM measurement of the image of the sample by the known dimension of the sample. The magnification calibration information may then be used to construct a calibration curve, or the SEM's magnification controls may be trimmed accordingly.

Calibration according to these prior methods requires samples of known dimensions. Even if the actual dimensions of a sample are known, however, they may change. In particular, repeated usage of a single reference sample as a calibration standard results in degradation of the reference sample. Charge buildup on a reference sample caused by repeated measurement in an SEM affects the secondary electron emission. Contaminant deposition or buildup also has deleterious effects on measurement of a calibration standard reference sample over time. Conventional SEM calibration methods and systems do not account for degradation in reference features. Thus, repeated use of the same reference sample may lead to SEM calibration error over time, as the reference sample feature size changes.

The measurement of a calibration standard reference sample typically involves determining where an edge of the sample is. At the sub-micron range, an edge of a sample may be a complex waveform, as opposed to a flat line. Therefore, in measuring the sample, assumptions must be made as to edge location, which lead to errors. Where the calibration involves determining the length (or width) of a sample, two edges must be located, and thus the edge determination errors are doubled. Further, sample dimensions may vary as a function of temperature. The SEM electron beam may thus cause expansion of a reference sample after repeated use.

In order to reduce edge determination error, SEM calibration has also been done using a sample having a series of equally spaced lines. Such a sample could be a diffraction grating having a plurality of aligned parallel grooves. The SEM may be used to measure the pitch of the lines. While this method reduces some of the edge quantification errors associated with other SEM calibration methods, higher accuracy calibration methods are needed for SEMs used for measuring high density semiconductor devices.

Conventional SEM calibration methods and systems do not account for degradation of a calibration standard reference sample over time. For example, where a line width feature on a reference sample has a known width, repeated scanning of the feature by an SEM results in charge buildup. This reduces or hampers the ability of an SEM to obtain accurate measurements of the line width in the future. Corrosion deposition on a reference sample feature also prevents or hampers accurate readings. Mask references are particularly susceptible to carbon contamination. Because conventional SEM calibration methods and systems rely upon accurate SEM readings of a known reference feature dimension, inaccurate SEM readings of a calibration standard reference feature cause errors in measurements of workpiece features performed with the SEM.

SUMMARY OF THE INVENTION

The present invention provides a method and system for calibrating a scanning electron microscope, which minimizes or reduces the disadvantages associated with conventional methods and systems. In accordance with one aspect of the present invention, there is provided a method and system for calibrating an SEM using a reference having multiple features of different dimensions and/or spatial interrelationships, wherein more than one feature dimension or spacing is measured using the SEM prior to measuring a workpiece. The dimensional and/or spatial measurements from the reference sample are correlated to obtain one or more calibration factors for the SEM. The calibration factor or factors may then be correlated with a workpiece SEM measurement to obtain a workpiece critical dimension (CD). The method and system eliminate or minimize the effects of reference feature dimension variations, allowing such deviations to be detected and accounted for in the calibration of a SEM. In this regard, the correlation of the reference feature dimensions may comprise one or more of computing the slope of a curve, computing a zero offset, computing a calibration coefficient, curve fitting, stochastics, neural networks, artificial intelligence, data fusion techniques, and/or trending, according to another aspect of the invention.

According to another aspect of the present invention, one or more correlation curves may be generated from the reference sample SEM measurements for analysis in calibrating the SEM. The curves may comprise measured line width or pitch versus actual line width or pitch, or even actual or measured width versus actual or measured pitch. In this way, the correlation may utilize curve fitting, stochastics, neural networks, artificial intelligence, data fusion techniques, trending, and the like, to account for variations in reference sample feature dimensions in determining one or more calibration factors for the SEM.

In accordance with another aspect of the present invention, there is provided a method for calibrating a scanning electron microscope, comprising providing a reference sample having a first line with a first line width, and a second line with a second line width, and measuring the first and second line widths using the scanning electron microscope. The method further comprises correlating the first line width measurement with the second line width measurement to obtain at least one calibration factor.

In accordance with yet another aspect of the present invention, there is provided a method for calibrating a scanning electron microscope, comprising providing a reference sample having a first line set with generally parallel lines of a first pitch, and a second line set with generally parallel lines of a second pitch, measuring the first pitch using the scanning electron microscope, and measuring the second pitch using the scanning electron microscope. The first pitch measurement and the second pitch measurement are then correlated to obtain at least one calibration factor for the SEM.

In accordance with still another aspect of the invention, there is provided a method for calibrating a scanning electron microscope, comprising providing a reference sample having a first line set with generally parallel lines of a first line width and a first pitch, and a second line set with generally parallel lines of a second line width and a second pitch, measuring at least one of the first line width and the first pitch using the scanning electron microscope, and measuring at least one of the second line width and the second pitch using the scanning electron microscope. The method further comprises correlating at least one of the first line width measurement and the first pitch measurement with at least one of the second line width measurement and the second pitch measurement to obtain at least one calibration factor. The correlation may comprise one or more of computing the slope of a curve, computing a zero offset, computing a calibration coefficient, curve fitting, stochastics, neural networks, artificial intelligence, data fusion techniques, and trending, in order to calibrate the SEM.

Another aspect of the invention provides for measuring a workpiece feature using the scanning electron microscope to obtain a workpiece feature measurement, and correlating the workpiece feature measurement with at least one calibration factor to obtain a workpiece feature CD. In this way, the calibration factor or factors may be employed to adjust workpiece feature measurements in order to determine or obtain accurate workpiece feature CDs.

According to yet another aspect of the present invention, a system is provided for calibrating an SEM. The system may be utilized to implement the above methods according to the invention. The system may comprise a reference sample having a first line set with generally parallel lines of a first line width and a first pitch, and a second line set with generally parallel lines of a second line width and a second pitch, a scanning electron microscope adapted to measure at least one of the first line width and the first pitch, and at least one of the second line width and the second pitch, and a processor or other device adapted to correlate at least one of the first line width measurement and the first pitch measurement with at least one of the second line width measurement and the second pitch measurement to obtain at least one calibration factor. The system provides for reduction or elimination of calibration errors associated with changing reference sample features such as line width, which were not accounted for in convention SEM calibration.

In accordance with yet another aspect of the invention, there is provided a system for calibrating a scanning electron microscope, comprising a reference sample having a first line set with generally parallel lines of a first line width and a first pitch, and a second line set with generally parallel lines of a second line width and a second pitch, a device for measuring at least one of the first line width and the first pitch, a device for measuring at least one of the second line width and the second pitch, and a device for correlating at least one of the first line width measurement and the first pitch measurement with at least one of the second line width measurement and the second pitch measurement to obtain at least one calibration factor. The calibration system accounts for degradation in a reference sample associated with repeated usage in a SEM, and further allows trending analysis of the reference sample degradation. In this way, a user may identify degradation in a reference sample feature, and take appropriate action without a corresponding degradation in SEM workpiece measurement accuracy.

To the accomplishment of the foregoing and related ends, the invention, then, comprises the features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 10 is a plan view of yet another exemplary reference sample which may be used in the methods and systems of the present invention;

DETAILED DESCRIPTION OF THE INVENTION

Figure 1:
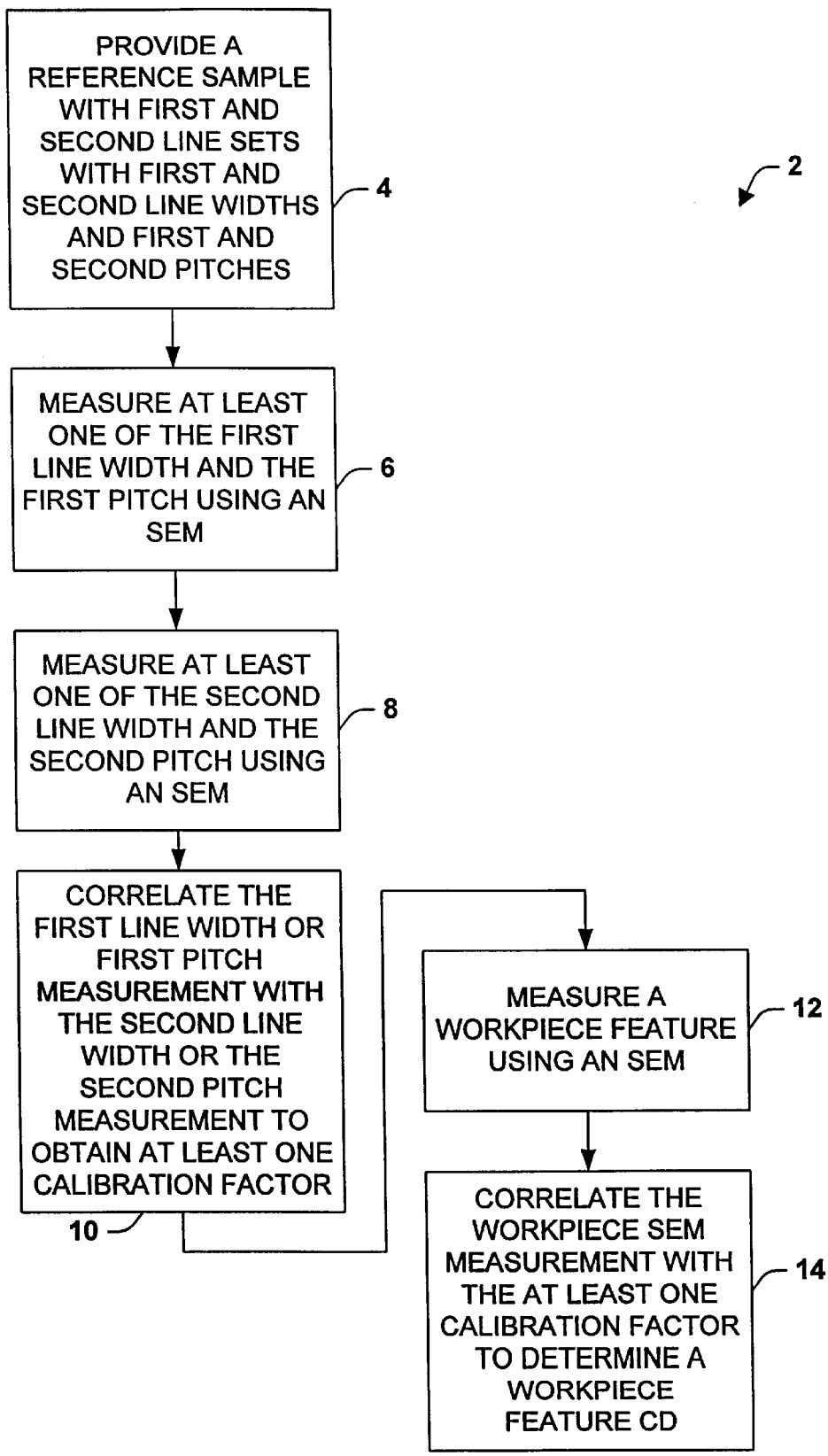
FIG. 1 is a block diagram illustrating a method for calibrating a scanning electron microscope in accordance with the present invention.

The present invention will now be described with reference to the drawings, wherein like reference numerals are used to refer to like elements throughout. The methods and systems of the invention reduce the calibration errors in scanning electron microscopes by measuring multiple feature dimensions and/or multiple line set pitches, and correlating the measurements to obtain one or more calibration factors. This provides for reduction or elimination of errors due to reference feature dimension degradation, as described in more detail infra. FIG. 1 illustrates a method 2 for calibrating a scanning electron microscope. A reference sample is provided having first and second line sets at step 4. The first and second line sets have a line width and pitch associated therewith, at least one of which are measured at steps 6 and 8, respectively, with an SEM. The line set measurements are then correlated at step 10 whereby at least one calibration factor is obtained. The correlation may comprise one or more of computing the slope of a curve, computing a zero offset, computing a calibration coefficient, curve fitting, stochastics, neural networks, artificial intelligence, data fusion techniques, and trending, in order to calibrate the SEM. By this calibration method, degradation in reference feature sizes may be accounted for, and the degraded reference features may be identified by a user. Thus, system accuracy may be preserved, even where one or more reference sample features have degraded.

Once the calibration factor or factors have been obtained via reference sample SEM measurements, a feature of interest on a workpiece may be measured at step 12 using the SEM, and a workpiece feature CD is obtained at step 14 by correlating the workpiece SEM measurement with at least one calibration factor. In a typical application, the calibration method may be employed periodically or regularly, whereby reference sample degradation trends may be both monitored and accounted for in the calibration correlation. Although a reference sample feature may degrade, as for example, through repeated measurement in a SEM, the method of the present invention allows accurate calibration of the SEM instrument through the use of one or more calibration algorithms, as for example, computing the slope of a curve, computing a zero offset, computing a calibration coefficient, curve fitting, stochastics, neural networks, artificial intelligence, data fusion techniques, and trending.

The method of FIG. 1 reduces or eliminates the effects of reference sample degradation on the CD measurement of the workpiece, since the various line width and pitch measurements of the reference sample may be used to correlate the SEM reference sample measurement. In particular, charge accumulation and contamination deposition associated with repeated usage of a reference sample in a SEM system, may be accounted for because, while a particular line width on the sample may change, the pitch of a line set generally will not. Furthermore, a user may perform trending analysis to determine the extent of a reference sample's degradation, and calibrate out the effects associated therewith through the correlation of the various line width and pitch measurements. In addition to those mentioned above, the effects associated with carbon contamination and charge accumulation, as well as temperature effects, may be taken into account in the correlation.

Figure 2:
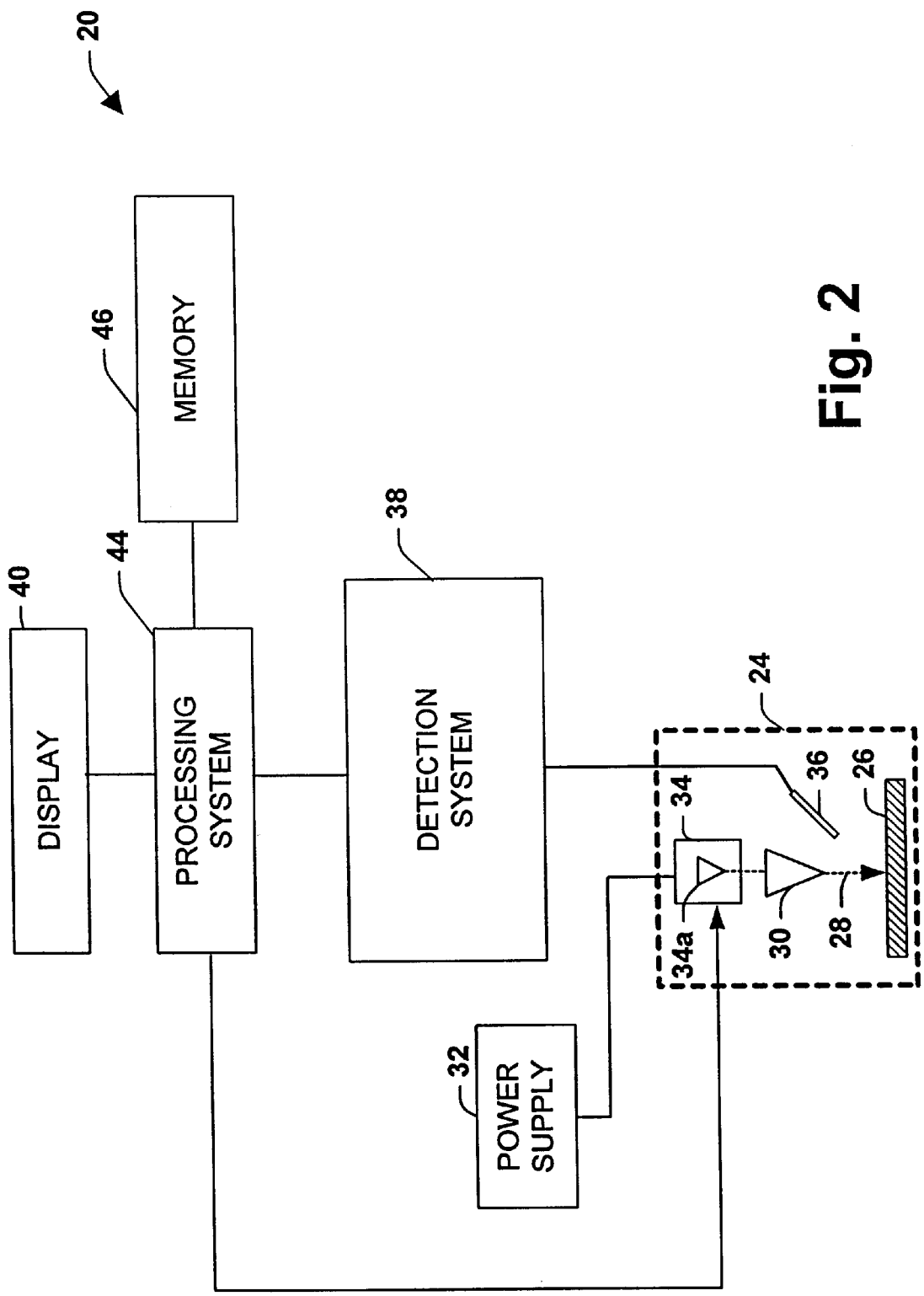
FIG. 2 is a schematic diagram illustrating a conventional scanning electron microscope.

The aspects of the present invention will be further illustrated hereinafter, in comparison with convention SEM calibration techniques and systems, which are discussed to provide context for the invention. In particular, FIG. 2 illustrates a CD-SEM system 20 including a chamber 24 for housing a wafer 26. In order to measure the wafer 26, an electron beam 28 is directed from an electromagnetic lens 30 toward the wafer 26. The electron beam 28 is created from high voltage supplied by a power supply 32 associated with a beam generating system 34 which includes an emission element 34a. Various directing, focusing, and scanning elements (not shown) in the beam generating system 34 guide the electron beam 28 from the emission element 34a to the electromagnetic lens 30. The electron beam particles may be accelerated to energies from about 500 eV to 40 Kev. When the electron beam 28 strikes the surface of the wafer 26, electrons and x-rays are emitted which are detected by a detector 36 and are provided to a detection system 38. The detection system 38 provides signals to a processing system 44 for performing conventional critical dimension measurements, for example, to determine the width of a line or other feature of interest on the wafer 26.

Electrons which are emitted from the surface of the wafer 26 which are most useful for critical dimension imaging are known as secondary electrons and provide a substantial amount of the signal current received by the detector 36. A dimension image may also be directed to a display 40 by the processing system 44. The processing system 44, in addition to processing data received by the detection system 38, synchronizes the scanning of the display 40 with electron beam scanning of the wafer 26 to provide the image. Contrast of the displayed image is related to variations in the flux of electrons arriving at the detector 36 and is related to the yield of emitted electrons from the surface of the wafer 26 to the incident electrons from the electron beam 28.

The detection system 38 receives the electron emissions from the surface of the wafer 26 via the detector 36 and may digitize the information for the processing system 44. In addition, the detection system 38 may also provide filtering or other signal processing of the received signal. The processing system 44 provides dimension information to the display 40 and/or stores information in a memory 46.

A processor (not shown) is included in the processing system 44 for controlling the beam generating system 34, providing critical dimension measurements, and for performing signal analysis. It is to be appreciated that a plurality of processors and/or processing systems may be included as part of and/or external to the CD-SEM system 20. The processor in the processing system 44 is programmed to control and operate the various components within the CD-SEM system 20 in order to carry out the various functions associated with the measurement of the wafer 26.

A memory 46 is also included in the system 20. The memory 46 is operatively coupled to the processing system 44 and serves to store program code executed by the processor for carrying out operating functions of the system 20. The memory 46 also serves as a storage medium for temporarily storing information such as calibration data, critical dimension data, and other data. The power supply 32 also provides operating power to the CD-SEM system 20 along with providing a high voltage to the beam generating system 34.

Figure 3:
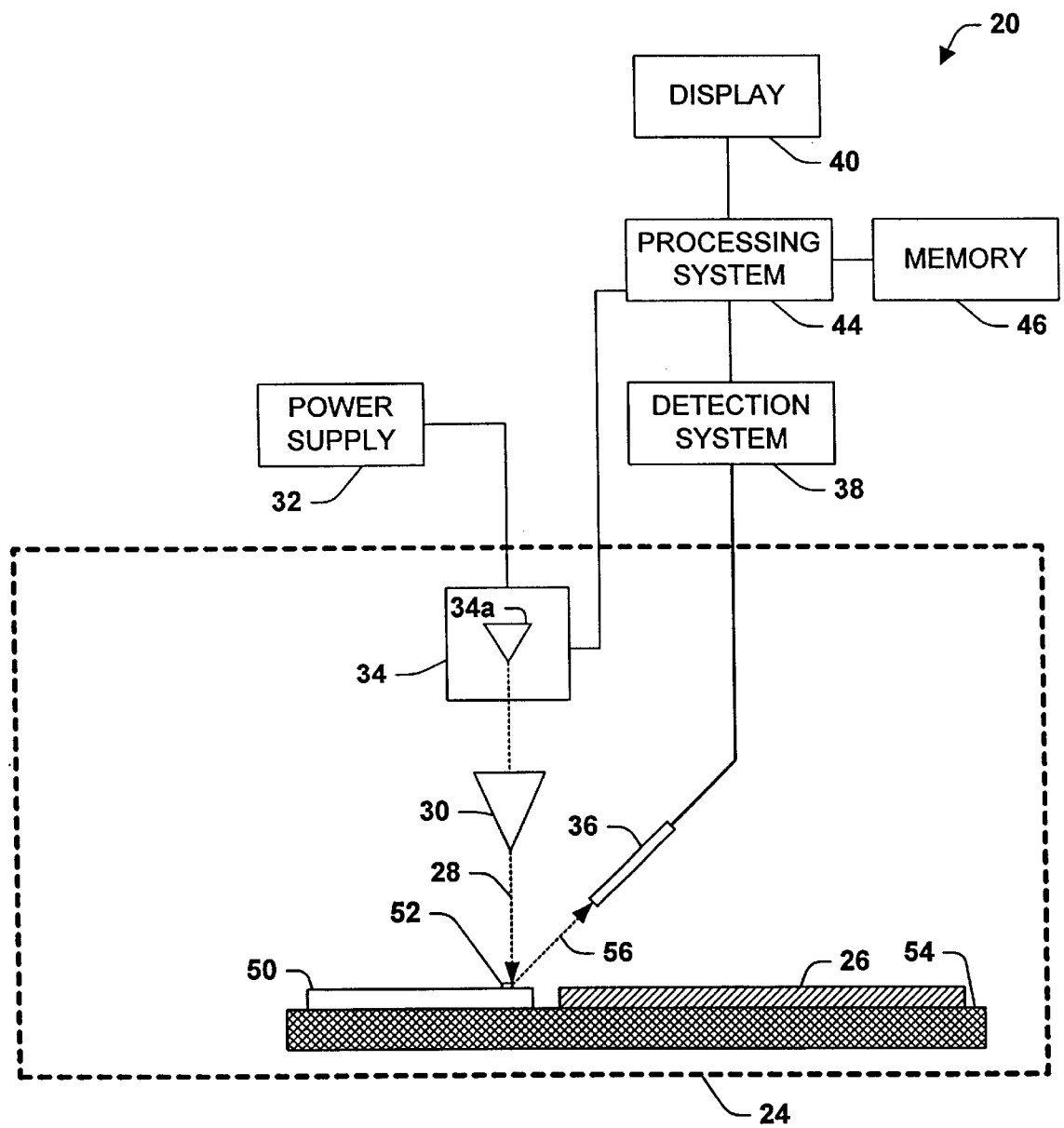
FIG. 3 is a schematic diagram illustrating a conventional system for calibrating a scanning electron microscope.

Referring now to FIG. 3, a conventional SEM calibration is shown, wherein a reference sample 50 having a reference feature 52 is located on a stage 54 and measured by the SEM system 20. The electron beam 28 is directed onto the feature 52, and the detector 36 senses the secondary electrons 56, in order to obtain an optical or SEM measurement of the feature 52 as the stage 54 is displaced relative to the lens 30 in one or more directions perpendicular to the electron beam 28.

Where a physical characteristic of the feature 52, such as for example, the width of a conductor line is of interest, the sample 50 may be scanned via movement of the stage 54, whereby a change in the secondary electrons 56 can be determined and a distance (e.g., line width) calculated. Where the line width of the reference feature 52 is known, the reference feature measurement may be used to calibrate the SEM prior to its use in measuring features of a workpiece, such as a semiconductor wafer 26. However, where the dimensions or other characteristics of the reference sample feature 52 are not preceisely know, or change, due to contamination, charge buildup, heat, or other causes, the conventional calibration method of FIG. 3 will not prevent errors in measuring workpiece feature CDs.

Figure 4:
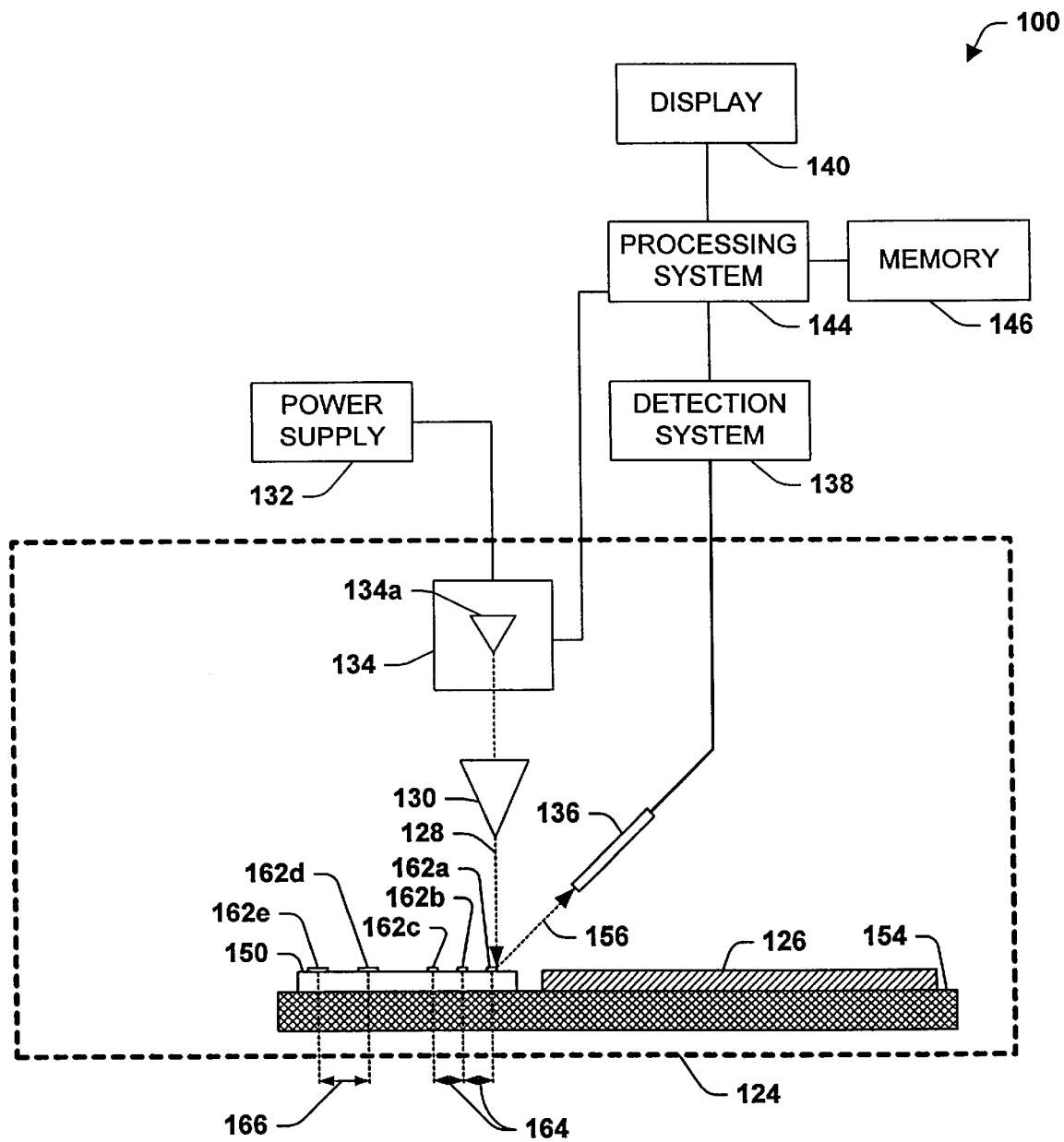
FIG. 4 is a schematic diagram illustrating a system and method for calibrating a scanning electron microscope in accordance with the invention.

Referring now to FIG. 4, a system and method for calibrating a scanning electron microscope are illustrated and described in accordance with the present invention. The system 100 comprises a beam generator 134 having an emission element 134a which provides an electron beam 128 through a lens 130 to a reference sample 150 and/or a workpiece 126, which are mounted on a stage 154 within a chamber 124, as will be discussed in greater detail infra. Secondary electrons 156 are sensed by a detector 136 which is operatively coupled to a detection system 138. A processing system 144 is provided which receives information from the detecting system 138. The processing system 144 provides critical dimension information to a display 140 and/or stores information in a memory 146. A processor (not shown) is included in the processing system 144 for controlling the beam generating system 134, providing critical dimension measurements, and for performing signal analysis. A plurality of processors and/or processing systems may be included as part of and/or external to the CD-SEM system 100 for performing signal analysis and other operations associated with performing the measurement and calibration methods according to the invention.

The processor in the processing system 144 is programmed to control and operate the various components within the CD-SEM system 100 in order to carry out the various functions described herein. The processor may be any of a plurality of processors, for example, such as the AMD Athlon, K6 or other type architecture processors. The memory 146 is operatively coupled to the processing system 144 and serves to store program code executed by the processor for carrying out operating functions of the system 100 as described herein. The memory 146 also serves as a storage medium for temporarily storing information such as calibration data, critical dimension data, statistical data, trending information, and other data which may be employed in carrying out the present invention. The power supply 132 also provides operating power to the CD-SEM system 100 along with providing a high voltage to the beam generating system 134. Any suitable power supply (e.g., linear, switching) may be employed to carry out the present invention. In addition, the stage 154 is adapted to move horizontally with respect to the vertical electron beam 128 to effect a scanning of the workpiece 126 and/or the reference sample 150 by the beam 128.

In addition to the programs and instructions for carrying out SEM measurements, the processing system 144 is adapted to receive and analyze data (not shown) relating to pitch and/or line width measurements of various features 162 on the reference sample 150. In this regard, the processing system 144 and/or the memory 146 may include programs and instructions for performing various mathematical algorithms, such as for example, computation of one or more calibration or scaling factors, stochastics, neural networks, artificial intelligence, data fusion techniques, and the like. These algorithms may be advantageously used to correlate reference feature measurement data relating to feature size and/or spacing (e.g., line width and pitch) in order to calibrate the SEM system 100 as described in greater detail infra. In particular, the processing system 144 may be used to correlate reference pitch and/or width measurements of reference features 162 in order to obtain or determine one or more calibration factors, and further to correlate a workpiece feature SEM measurement with the calibration factor or factors to obtain or determine a workpiece feature CD, in accordance with one aspect of the present invention. The correlation of reference feature dimension and spacing information (e.g., line width and pitch) reduces or eliminates prior calibration errors associated with charge buildup, corrosion, and other degradation of a reference sample resulting from repeated usage in a SEM, temperature change, and the like.

Reference sample feature dimensions and/or spacing are thus measured using the system 100. With the stage 154 positioned as shown in FIG. 4 and a beam 128 generated by the beam generating system 134, the system 100 may perform an SEM measurement of the feature 162a. The stage may then be moved horizontally in order to effect a scanning by the beam 128 of the line features 162a, 162b and 162c, which form a first line set. The line features 162a, 162b, and 162c are illustrated as having approximately equal line widths (not numerically designated), and pitch 164. The stage 154 may then be moved horizontally to measure the features 162d and/or 162e of the reference sample 150. The features 162d and 162e are of approximately equal line width (not numerically designated), and form a second line set having a pitch 166. The system may measure the line widths of features 162a, 162b, 162c, and those of features 162d and 162e, as well as the pitches 164 and/or 166 of the first and second line sets. The measurements may then be correlated to obtain one or more calibration factors, as discussed in greater detail infra.

It will be appreciated that the reference feature measurements may be of two or more lines of different widths, or of two or more line sets of different pitches, whereby a correlation can be achieved by various processing techniques. In addition, although the features 162 are illustrated as two sets of parallel lines, with the lines within each set having generally equal line widths, other embodiments are contemplated as within the scope of the present invention, such as, for example, a line set having lines of various widths with equal pitch, multiple line sets having lines of generally equal width at varying pitches, and features which are non-linear.

With the reference feature measurements thus obtained, the processing system 144 may then correlate some or all of the dimensional and spatial information (e.g., line width and pitch data) in order to obtain one or more calibration factors for the system 100. This correlation advantageously provides for calibration of the SEM measurement, and may include compensation for variations in one or more reference feature sizes, as well as corrosion, charge accumulation, temperature, and other deleterious degradation of a reference sample feature 162.

As an example, where the electrical and optical reference feature measurements are taken periodically (e.g., daily, weekly, etc.), trending analysis can be performed by the processing system 144, whereby the degradation of a reference sample feature 162 may be determined. As an example, trending may show that the SEM measurement of the line width of reference feature 162a remains fairly constant over a period of time, while the width of feature 162c decreases (or increases) over the same timer period. This may be used, for example, to determine that a new reference sample is needed, or that the data associated with feature 162c may be discounted in future calibrations.

In addition to trending analysis, the processing system 144 may further perform data fusion analysis, wherein the dimensional and/or spacing measurements are analyzed to determine other variables affecting system performance. In this context, data fusion is algorithmic processing of measurement data or information to compensate for the inherent fragmentation of information because a particular phenomena may not be observed directly using a single sensing element or measurement. In other words, the data fusion architecture provides a suitable framework to facilitate condensing, combining, evaluating and interpreting the available optical and electrical measurement data or information in the context of the particular application, such as an SEM system 100.

It will be appreciated that the degradation of a reference sample feature 162 may affect the dimensional and spacing measurements thereof differently, and that the correlation thereof provides for improved calibration capabilities within the present invention. For example, the width of a line 162a in a first line set comprising line features 162a, 162b, and 162c, may change, while the pitch of the line set remains constant. In this regard, the use of pitch information in the calibration correlation, may provide an indication that a particular line width has changed. Moreover, it will be recognized that many algorithms and correlation techniques are available to compensate for reference sample feature degradation, variation, and other errors in the system 100, for example, computing calibration scaling factors, curve fitting, stochastics, neural networks, artificial intelligence, data fusion techniques, mathematical prediction/correction techniques, and the like.

Figure 5:
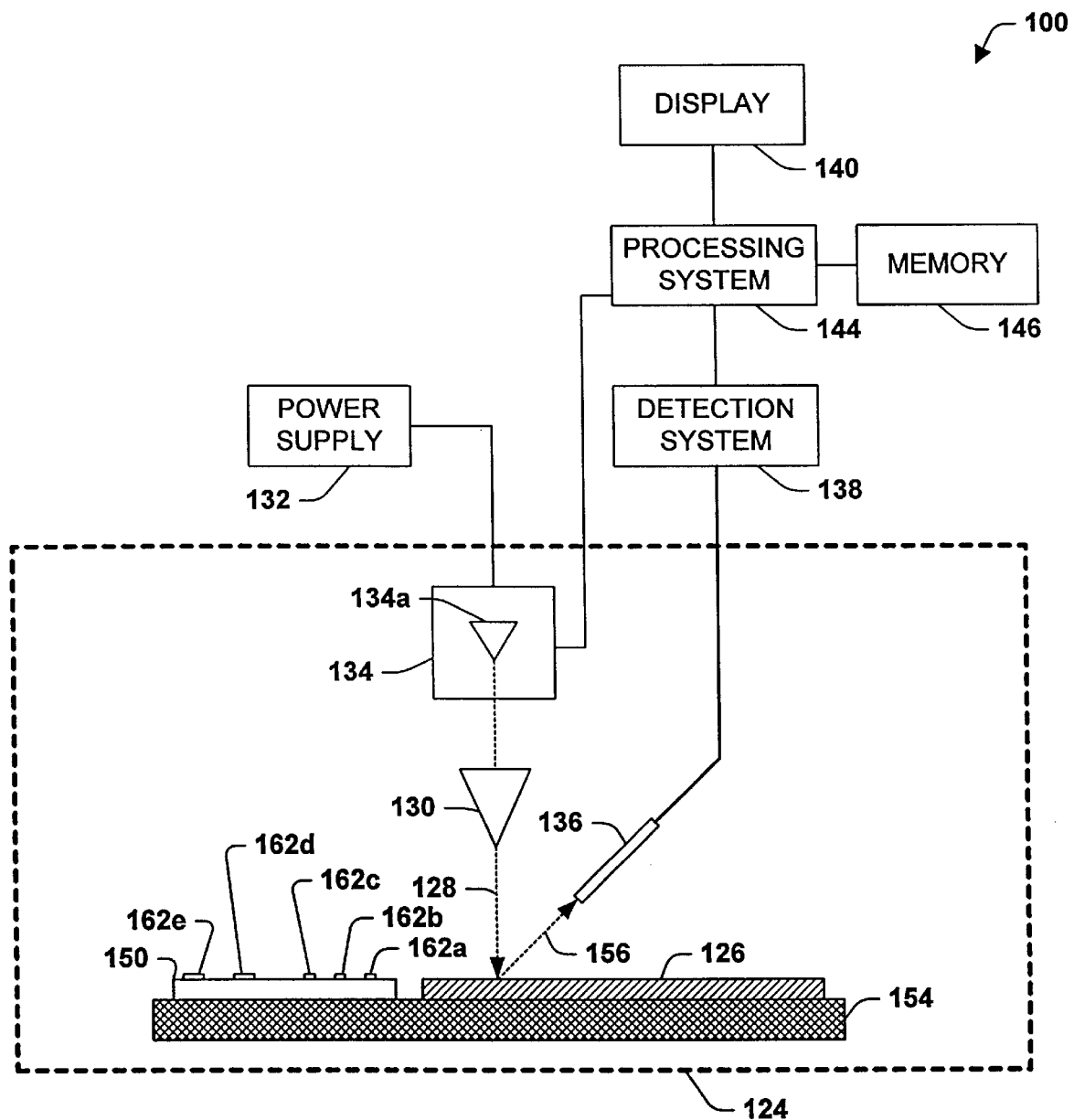
FIG. 5 is a schematic diagram illustrating the system and method for calibrating a scanning electron microscope of FIG. 4.

Referring also to FIG. 5, once the calibration factor or factors have been obtained or determined, the stage 154 may positioned such that the workpiece 126 is beneath the electron beam 128. Thereafter, the system 100 may perform an SEM scan of one or more features of interest (not shown) on the workpiece 126, with workpiece feature measurement data or information being provided to the processing system 144 via the detection system 138. The processing system 144 may then correlate the workpiece feature measurement data with one or more calibration factors in order to obtain or determine a workpiece feature CD. As with the correlation of the reference sample dimensional and/or spacing measurements discussed supra, the correlation of the calibration factor or factors with the SEM workpiece feature measurement by the processing system 144 may comprise, for example, curve fitting, stochastics, neural networks, artificial intelligence, data fusion techniques, mathematical prediction/correction techniques, and the like.

It will be appreciated that the workpiece feature measurement may be performed prior to the reference sample measurements, and further that the reference feature measurements (dimensional and spatial) may be performed in any order or simultaneously. Furthermore, the measurements need not be performed contemporaneously, since the correlation algorithms and trending analysis may account for the time the various measurements are made. In this way, a workpiece CD may be obtained for a workpiece measured, for example, a week prior to the calibration reference feature measurements used to correlate the workpiece measurements, etc.

Figure 6:
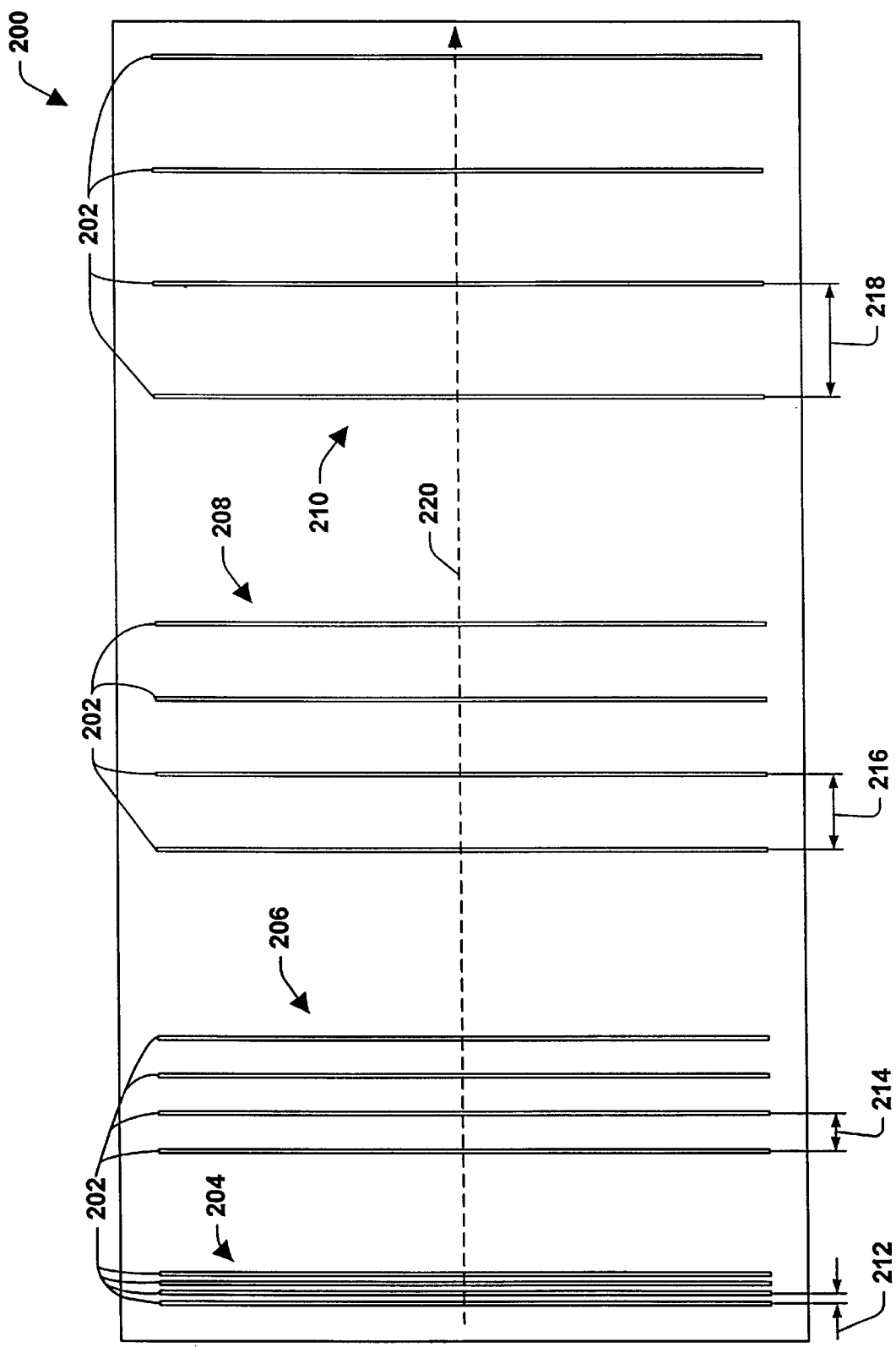
FIG. 6 is a plan view of an exemplary reference sample which may be used in the methods and systems of the present invention.

Referring now to FIG. 6, an exemplary reference sample 200 is illustrated, having multiple parallel linear features 202 located so as to form line sets 204, 206, 208, and 210. In the reference sample 200, the widths of the line features 202 are generally equal, and the pitches 212, 214, 216, and 218, respectively, of the line sets 204, 206, 208, and 210 are different. An SEM, such as that of the system 100 of FIGS. 4 and 5, may scan along a scan line 220 (or other paths generally parallel thereto) one or more times in order to measure the widths of the line features 202, and/or the pitches 212, 214, 216, and/or 218 of the line sets 204, 206, 208, and/or 210, respectively. The line width and/or pitch measurements may then be correlated by the processing system 144 of system 100 to obtain one or more calibration factors. These calibration factors, in turn, may be employed to provide workpiece feature CDs based on correlation of a workpiece feature measurement and the calibration factor or factors.

Figure 7:
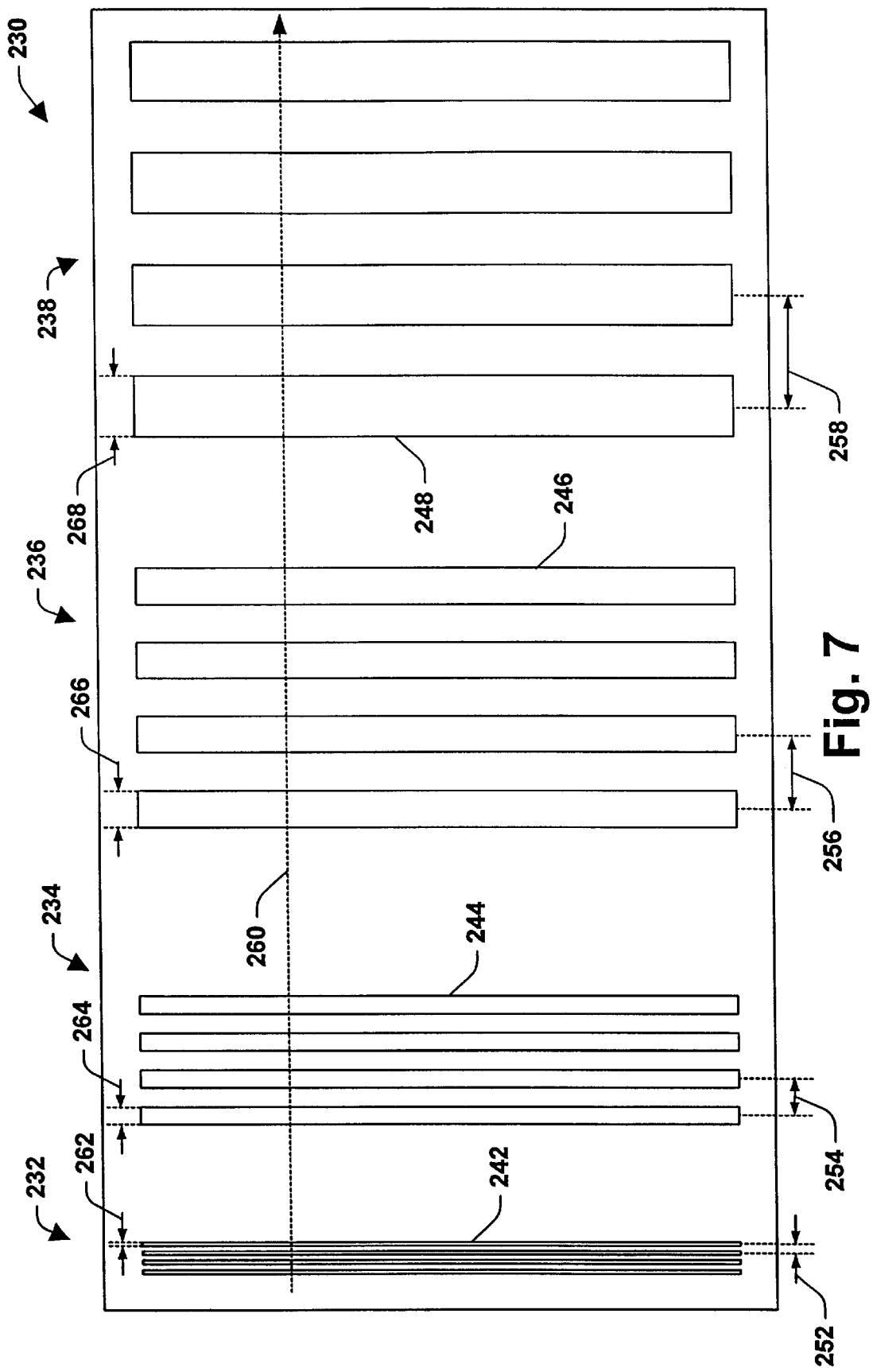
FIG. 7 is a plan view of another exemplary reference sample which may be used in the methods and systems of the present invention.
Figure 8:
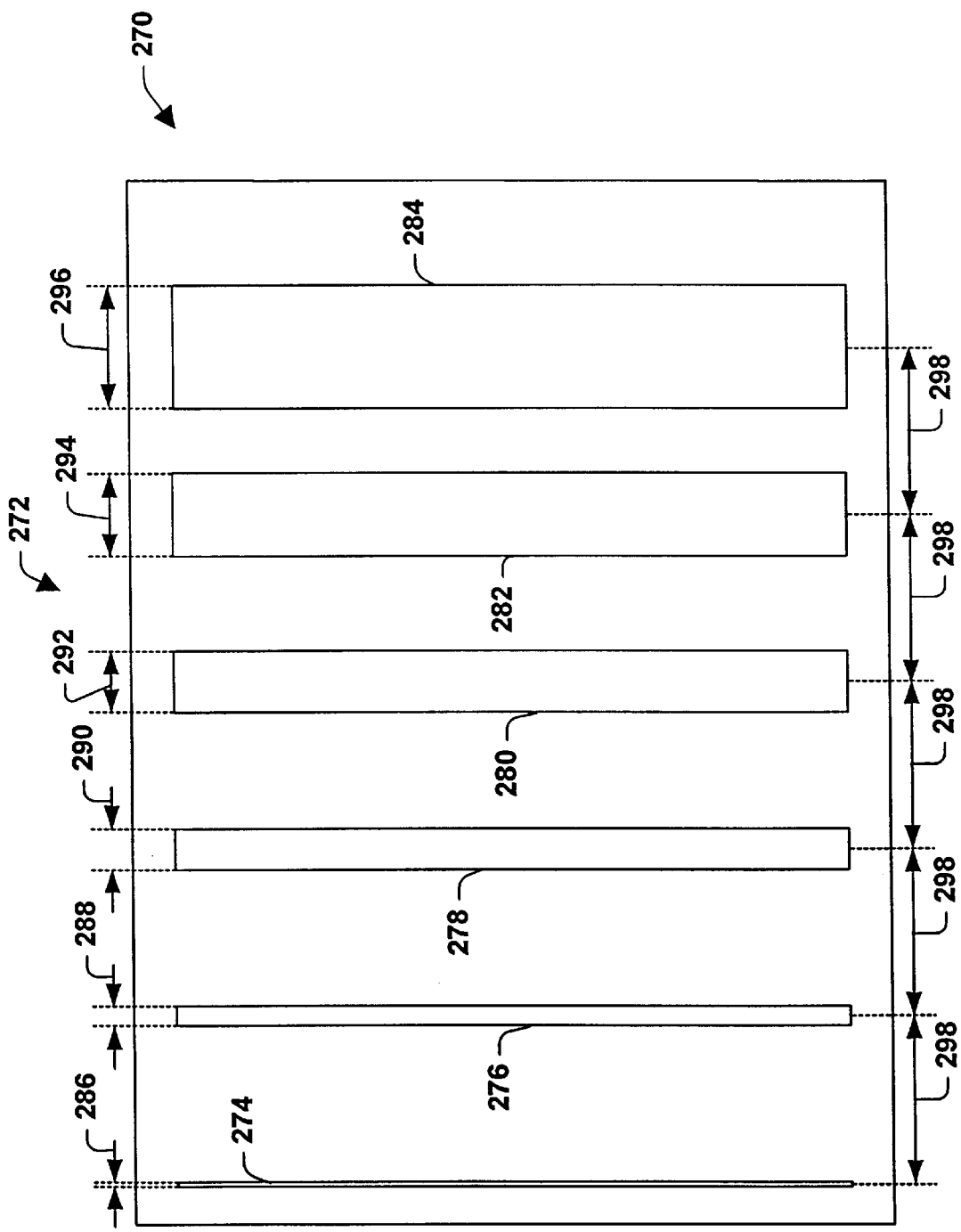
FIG. 8 is a plan view of still another exemplary reference sample which may be used in the methods and systems of the present invention.

Referring now to FIG. 7, another exemplary reference sample 230 is illustrated having line sets 232, 234, 236, and 238, wherein the line features 242, 244, 246, and 248, respectively therein, are of generally equal width. The line sets 232, 234, 236, and 238 have pitches 252, 254, 256, and 258 associated therewith, respectively. The reference sample 230 allows SEM measurement of several different line widths 262, 264, 266, and/or 268, as well as several different pitches 252, 254, 256, and/or 258, along a scan line 260, which may be correlated to obtain calibration factors in accordance with the invention. Referring also to FIG. 8, another reference sample 270 is illustrated having a single line set 272 comprising six line features 274, 276, 278, 280, 282, and 284 with line widths 286, 288, 290, 292, 294, and 296, respectively. The line set 272 comprises a single pitch 298. This allows an SEM scan along scan line 299 to measure several different line widths and a single pitch.

Figure 9:
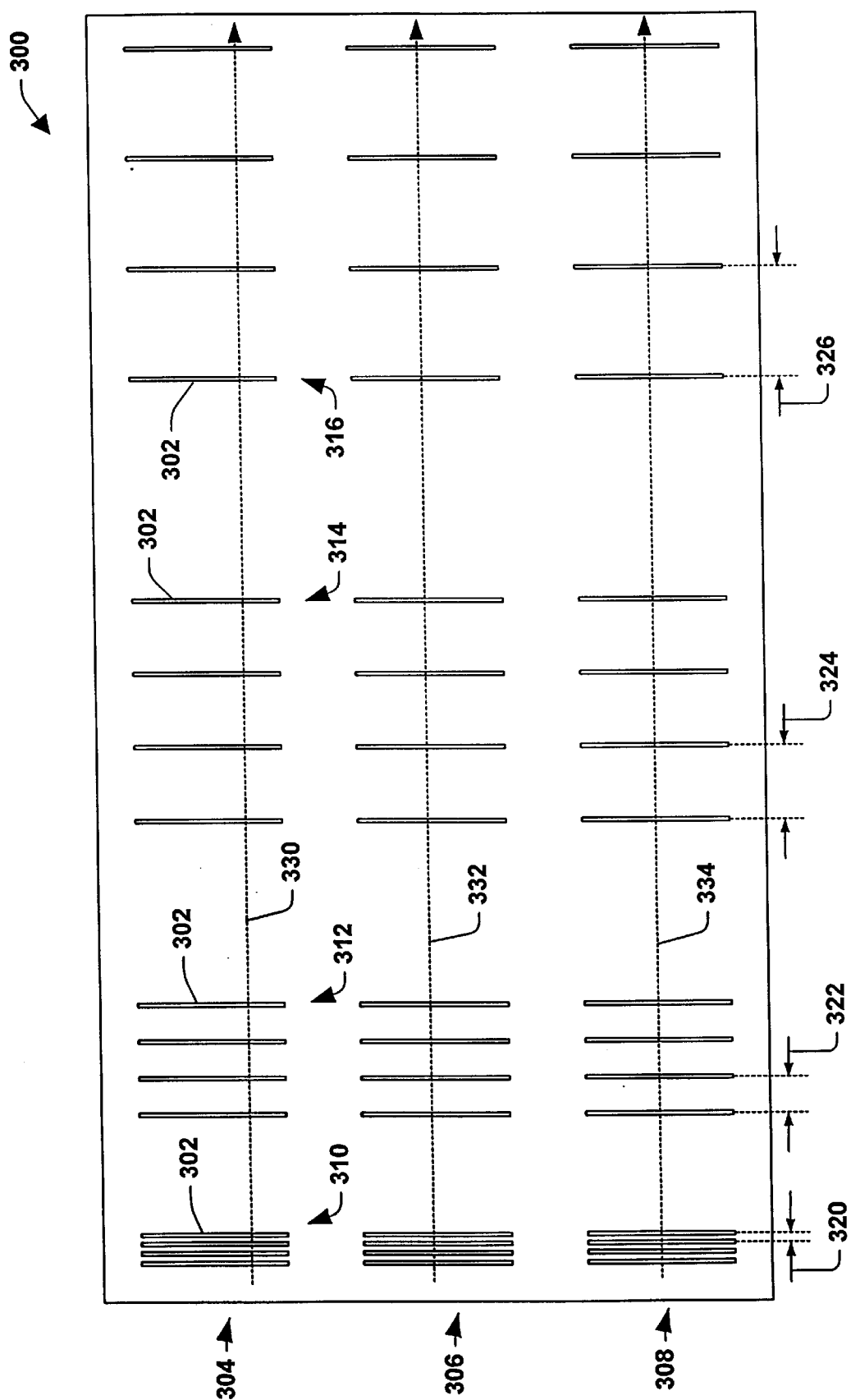
FIG. 9 is a plan view of yet another exemplary reference sample which may be used in the methods and systems of the present invention.

Several different combinations of line width and pitch patterns may be combined in one reference sample, as are illustrated in FIGS. 9 and 10. In particular, FIG. 9 illustrates one exemplary reference sample 300 wherein line features 302 are provided in three rows 304, 306, and 308. The feature lines 302 are grouped into line sets 310, 312, 314, and 316 within each row, having pitches 320, 322, 324, and 326, respectively. The provision of multiple rows 304, 306, and 308 of line sets 310, 312, 314, and 316 in the reference sample 300 allows more data to be measured for correlation in determining the calibration factors according to the invention. Thus, the SEM system 100 may scan the sample 300 along scan lines 330, 332, and 334 each time the system 100 is calibrated. As another example, the system 100 may scan only row 304 along scan line 330. Where it is found via the reference feature measurement correlation, that certain reference feature lines 302 in row 304, have changed, the other rows 306 and/or 308 may be utilized by scanning along lines 332 and/or 334 without requiring a new reference sample.

Referring also to FIG. 10, another exemplary reference sample 350 is illustrated, in which multiple line features (not designated numerically) are located in three rows 352, 354, and 356. In this example, the reference sample 350 provides the capability of measuring several line sets 360, 362, 364, and 366 of lines of generally equal width (not numerically designated) in the row 352, with the pitch (not numerically designated) associated with each line set 360, 362, 364, and 366 being different. In this regard, the SEM system 100 may measure the line features of row 352 along a scan line 368. Row 354 may be used for measurement of several line sets 370, 372, 374, and 376 along a scan line 378, wherein different line widths and pitches (not numerically designated) are provided. Row 356 may be scanned along a scan line 380, whereby a reference measurement may be made of the line features (not numerically designated) arranged with varying widths and a single pitch. The reference samples shown in FIGS. 4–10 illustrate several advantageous configurations of linear features which may be used in implementing the systems and methods of the present invention. Many other reference samples are possible having different configurations of features measurable by an SEM, and are considered as falling within the scope of the invention. In this regard, the features need not be linear, nor need they be arranged in rows or columns.

Figure 11A:
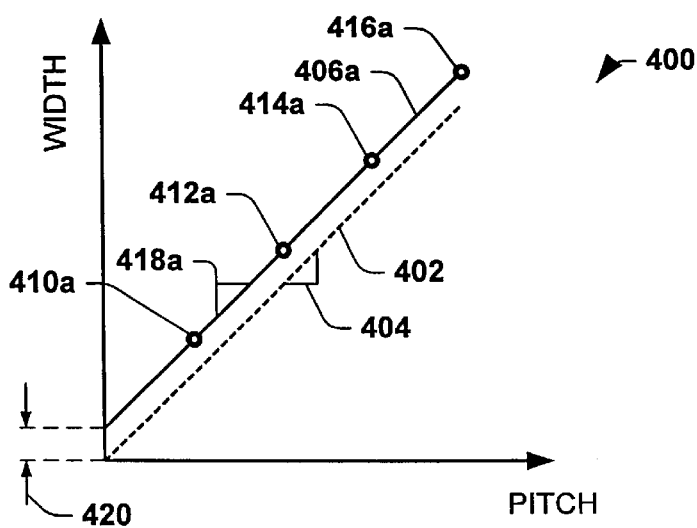
FIG. 11a is an exemplary graph illustrating a correlation of width and pitch which may be used in the methods and systems of the present invention.
Figure 11B:
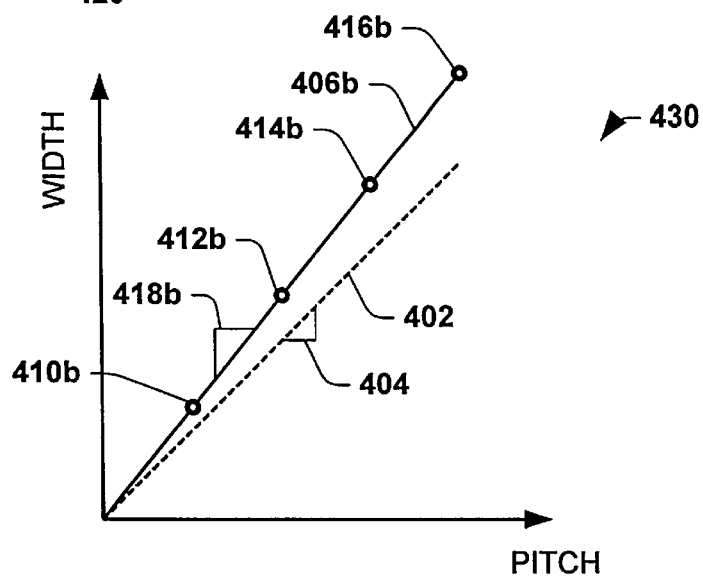
FIG. 11b is another exemplary graph illustrating a correlation of width and pitch which may be used in the methods and systems of the present invention.
Figure 11C:
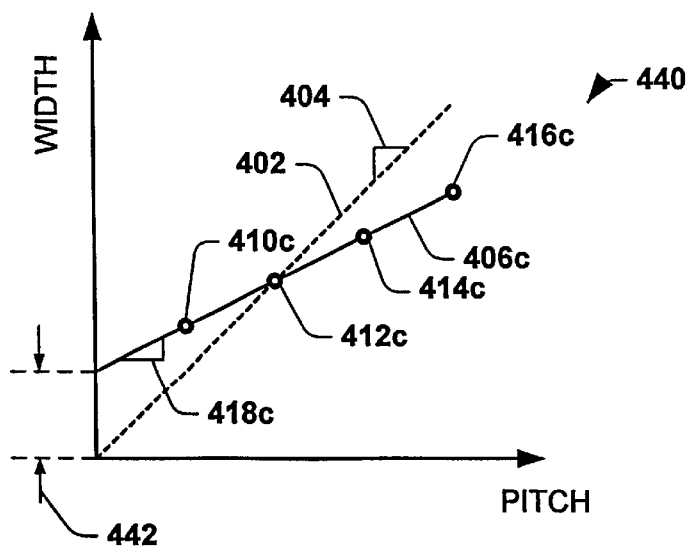
FIG. 11c is another exemplary graph illustrating a correlation of width and pitch which may be used in the methods and systems of the present invention.

Referring now to FIGS. 11a, 11b and 11c, measured reference feature data may be correlated using curve fitting techniques, in order to obtain one or more calibration factors for the SEM system 100. Several possible correlations are hereinafter described for illustration of various aspects of the invention. However, it will be appreciated that many different correlation methodologies fall within the scope of the present invention, and that those which are discussed hereinafter are illustrative of the invention, and not a limitation thereon. The reference sample feature dimensional and spatial values may be initially known.

Referring also to FIG. 10, and particularly to row 354, an SEM scan along line 378 allows measurement of line sets 370, 372, 374, and/or 376, whose line widths and pitches (not numerically designated) may initially be known. The line sets 370, 372, 374, and 376 each include line widths approximately one half the pitch, wherein the line width approximates the spacing between the line features. In the graph 400 of FIG. 11a, a line 402 represents the theoretical correlation between feature line width on the Y axis and line set pitch on the X axis. Because of the arrangement of the line sets in row 354 of sample 350, the line 402 is straight, having a constant slope 404 and no Y axis offset. Upon taking SEM line width and pitch measurements along scan line 378, a measurement correlation curve 406a may be determined using curve fitting or other mathematical techniques.

In FIG. 11a, data points 410a, 412a, 414a, and 416a correspond to width and pitch measurements of line sets 370, 372, 374, and 376, respectively. In this example, it is seen that the measurement correlation curve 406a is above and generally parallel with the theoretical line 402, thus the measurement curve slope 418a will be the same as the slope 404 of curve 402. An exemplary correlation, such as that of FIG. 11a, may thus indicate that the line width measurement capability of the SEM is in need of adjustment (e.g., span, gain, or magnification adjustment) to calibrate out the effects of the Y axis offset 420 between the curves 402 and 406a. This situation may also indicate that the line widths have increased, for example, due to charge buildup, temperature effects, and the like. The correlation may then be used to calculate, determine, or otherwise obtain one or more calibration factors via computing a zero offset, computing a calibration coefficient, curve fitting, stochastics, neural networks, artificial intelligence, data fusion techniques, trending, or other techniques. For example, the theoretical slope 404, the measurement curve slope 418a, and the Y axis offset 420, may be used by the processing system 144 to calculate a zero offset to compensate for offset conditions, and a gain factor to compensate for slope differences. In the example of FIG. 11a, a zero offset may be the negative of the Y axis offset value 420, and the gain factor may be 1.

Referring now to FIG. 11b, a graph 430 includes measurement data points 410b, 412b, 414b, and 416b along a measurement correlation curve 406b, corresponding to another set of width and pitch measurements by the SEM system 100 along scan line 378 of line sets 370, 372, 374, and 376 in FIG. 10. In this example, a correlation of the measurement curve 406b with theoretical curve 402 shows that there is no Y axis offset, but that the measurement curve slope 418b is greater than the slope 404 of the theoretical curve 402. The processing system 144 may obtain one or more calibration factors (e.g., gain factor, zero offset factor) based on the correlation of the measurement data points 410b, 412b, 414b, and/or 416b. As discussed supra, the calibration factors may then be correlated with workpiece feature measurements (either prior or subsequent) to obtain workpiece feature CDs.

Referring now to FIG. 11c, a graph 440 includes measurement data points 410c, 412c, 414c, and 416c along a measurement correlation curve 406c, corresponding to another set of width and pitch measurements by the SEM system 100 along scan line 378 of line sets 370, 372, 374, and 376 in FIG. 10. In graph 440, the slope 418c of the correlation curve 406c is less than the slope 404 of the theoretical curve 412. In addition, a non-zero Y axis offset 442 is present. The processing system 144 may obtain one or more calibration factors (e.g., gain factor, zero offset factor) based on the correlation of the measurement data points 410c, 412c, 414c, and/or 416c. The calibration factors may then be correlated with workpiece feature measurements to obtain workpiece feature CDs.

Figure 12A:
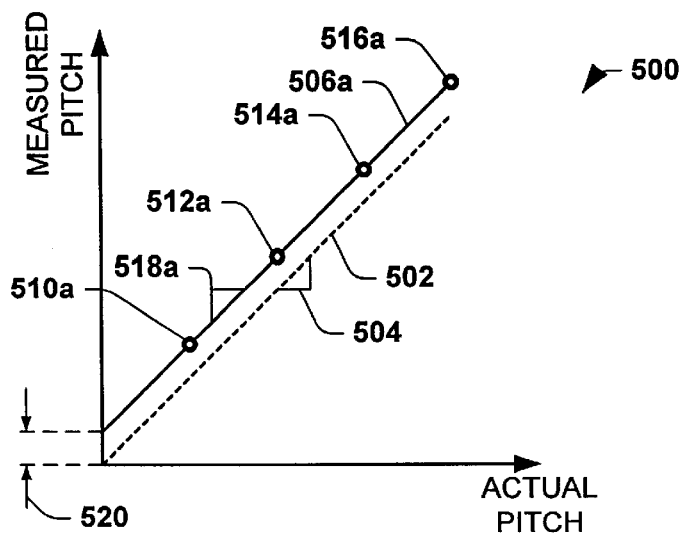
FIG. 12a is an exemplary graph illustrating a correlation of measured and actual pitch which may be used in the methods and systems of the present invention.
Figure 12B:
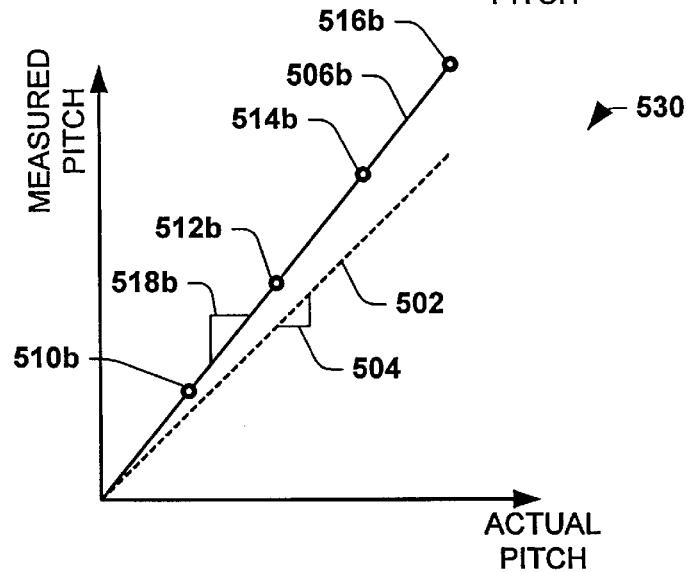
FIG. 12b is another exemplary graph illustrating a correlation of measured and actual pitch which may be used in the methods and systems of the present invention.
Figure 12C:
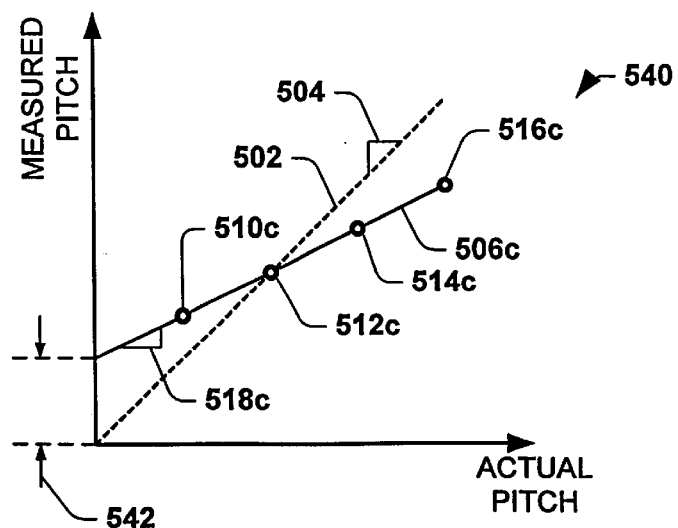
FIG. 12c is another exemplary graph illustrating a correlation of measured and actual pitch which may be used in the methods and systems of the present invention.

The correlations of FIGS. 11a, 11b, and 11c illustrate the concept of correlation of dimensional and spatial information (e.g., line width and pitch data) in calibration an SEM. Referring now to FIGS. 12a, 12b, and 12c, exemplary correlations are graphically illustrated wherein actual pitch information and measured pitch information are correlated. Again referring to the reference sample 350, pitch measurements 510a, 512a, 514a, and 516a may be taken of the line sets 370, 372, 374, and 376 along scan line 378. The measurements 510a, 512a, 514a, and 516a are used by the processing system 144 to construct a measurement correlation curve 506a illustrated in the graph 500 of FIG. 12a. The slope 518a of the correlation curve 506a in this example is the same as the slope 514 of a theoretical curve 502, and a Y axis offset 520 exists. Were the pitch measurements 510a, 512a, 514a, and 516a the same as the actual pitch (e.g., previously known pitch) values for the line sets 370, 372, 374, and 376 of reference sample 350, the curves 506a and 502 would be identical. In this example, however, the correlation by the processing system 144 indicates that the Y axis offset 520 exists, which may indicate that the magnification of the SEM system is in need of adjustment. The system 144 correlates the measurement information through one or more mathematical techniques in order to obtain one or more calibration factors (e.g., zero offset and gain factors) for use in obtaining workpiece measurement CDs as discussed supra.

Referring also to FIGS. 12b and 12c, graphs 530 and 540 illustrate other measurements (510b, 512b, 514b, 516b, and 510c, 512c, 514c, 516c, respectively) of the line sets 370, 372, 374, and 376 of reference sample 350. Correlation curve 506b has no Y axis offset, and the slope 518b thereof is greater than the slope 504 of the theoretical curve 502. Correlation curve 506c has a Y axis offset 542 associated therewith, and the slope 518c thereof is less than the slope 504. The system 144 correlates the measurements in determining calibration factors for the system 100, as discussed supra. The theoretical curve 502 in graphs 500, 530, and 540 will generally have a slope 504 equal to 1, since the X axis and Y axis both represent pitch.

Figure 13A:
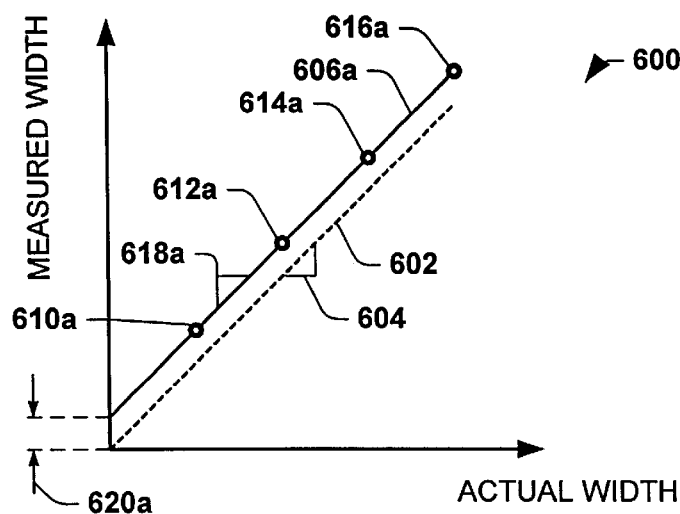
FIG. 13a is an exemplary graph illustrating a correlation of measured and actual width which may be used in the methods and systems of the present invention.
Figure 13B:
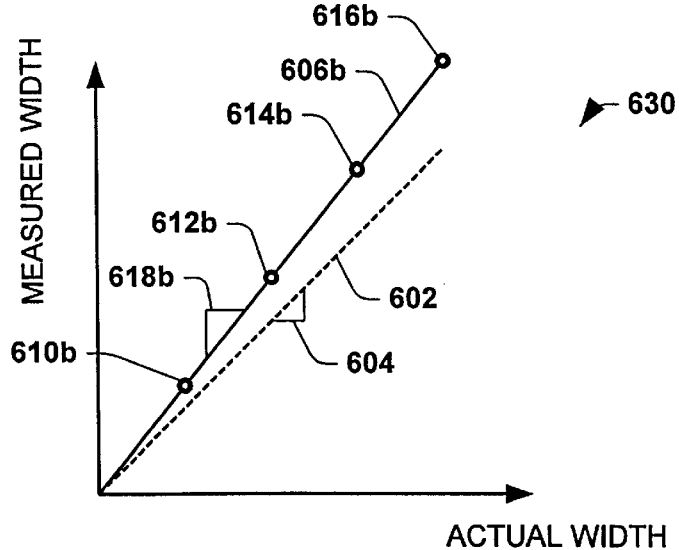
FIG. 13b is another exemplary graph illustrating a correlation of measured and actual width which may be used in the methods and systems of the present invention.
Figure 13C:
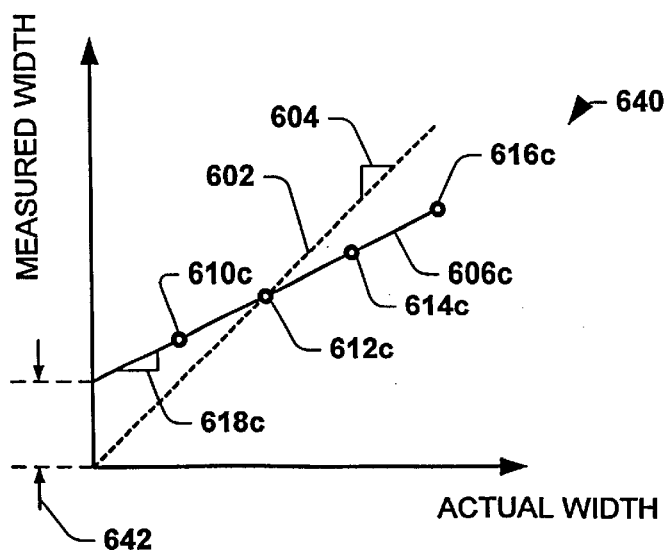
FIG. 13c is another exemplary graph illustrating a correlation of measured and actual width which may be used in the methods and systems of the present invention.

In similar fashion, measured and actual width information may be correlated, as illustrated in graphs 600, 630, and 640 of FIGS. 13a, 13b, and 13c, respectively. The measurements 610, 612, 614, and 616 of correlation curves 606 are of the line sets 370, 372, 374, and 376 of reference sample 350. The processing system 144 may correlate the measurements 610, 612, 614, and/or 616 to obtain one or more calibration factors for use in obtaining workpiece CDs. The correlation may take into account variations in curve slopes 618 from the theoretical value 604, as well as Y axis offsets 620, 642, etc., as described with respect to FIGS. 11*a*, 11*b*, 11*c*, 12*a*, 12*b*, and 12*c* supra. In addition to correlating measurement information to obtain one or more calibration factors, the system 144 may provide trending and other information to a user, for example, relating to the degradation of one or more features on a reference sample. Based on this information, a user may decide to discard a degraded reference sample and replace it with a new one, etc.

Figure 14A:
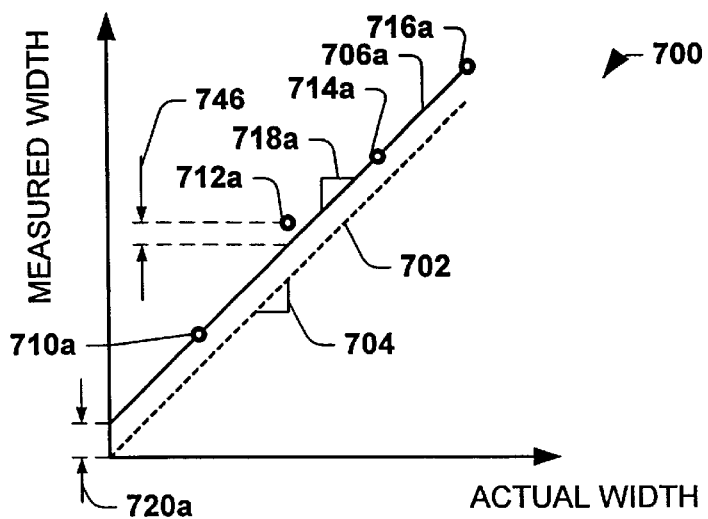
FIG. 14a is another exemplary graph illustrating a correlation of measured and actual width which may be used in the methods and systems of the present invention.

Referring now to FIG. 14*a*, a graph 700 includes measurements 710*a*, 712*a*, 714*a*, and 716*a* relating to SEM line width measurements along scan line 378 of line sets 370, 372, 374, and 376, respectively, of the reference sample 350 in FIG. 10. A measured line width curve 706*a* is shown with a slope 718*a*, along with a theoretical curve 702 with a slope 704. In this example, the measurement 712*a* is above the correlation curve 706*a*. This may indicate that the line features (not numerically designated) of the line set 372 have degraded, or otherwise have increased in width. This may also indicate some non-linearity in the SEM system 100.

Figure 14B:
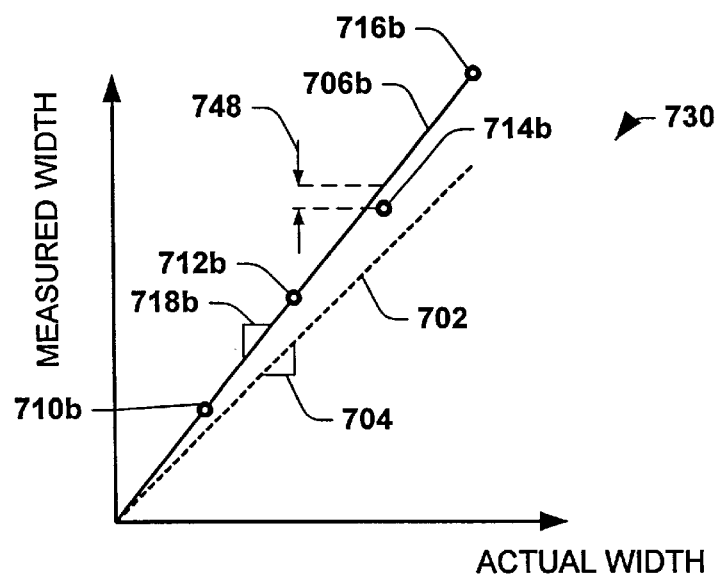
FIG. 14b is another exemplary graph illustrating a correlation of measured and actual width which may be used in the methods and systems of the present invention.
Figure 14C:
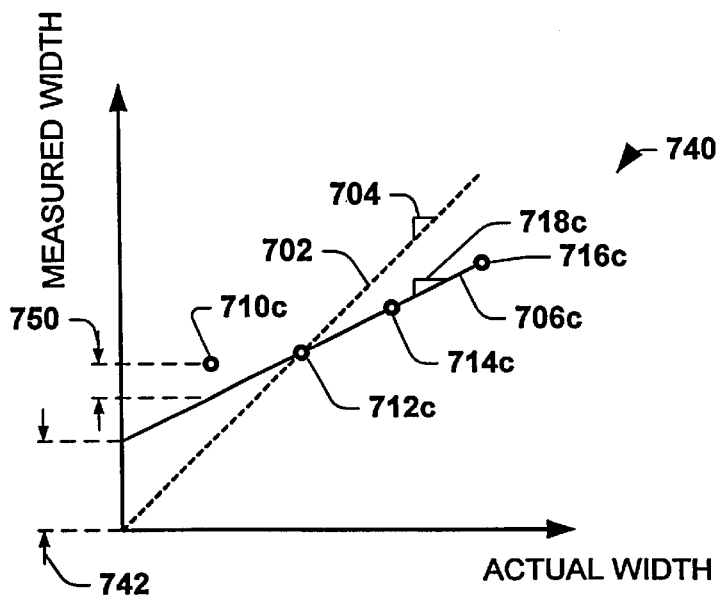
FIG. 14c is another exemplary graph illustrating a correlation of measured and actual width which may be used in the methods and systems of the present invention.

The processing system 144 may utilize various curve fitting techniques such as, for example, computing the slope of a curve, computing a zero offset, computing a calibration coefficient, curve fitting, stochastics, neural networks, artificial intelligence, data fusion techniques, and/or trending to determine the correlation curve 706*a* to be used in obtaining calibration factors for the system 100. As an example, the curve 706*a* is illustrated in FIG. 14*a* as generally linear, with the reading 712*a* discounted or discarded. In this regard, the system 144 may determine, for example, through trending analysis and the like, that a certain reference sample feature or line set, such as set 372, is unreliable, and may account for this in subsequent correlations. The correlations illustrated in FIGS. 14*a*, 14*b*, and 14*c*, show curve fitting wherein the correlation curves 706*a*, 706*b*, and 706*c*, respectively, have been determined with measurement points 712*a*, 714*b*, and 710*c*, respectively, discounted in the correlation. It will be appreciated that other correlations are possible within the scope of the invention wherein, for example, non-linear correlation curves (not shown) are constructed, or where the offsets 746, 748, and 750 in measurements 712*a*, 714*b*, and 710*c*, respectively, are otherwise taken into account. In this regard, system 144 may correlate the measurement information in a variety of ways, selectively taking into account some, none, or all non-linearities, offsets, slopes, etc., in obtaining one of more calibration factors for the SEM system 100.

Figure 15:
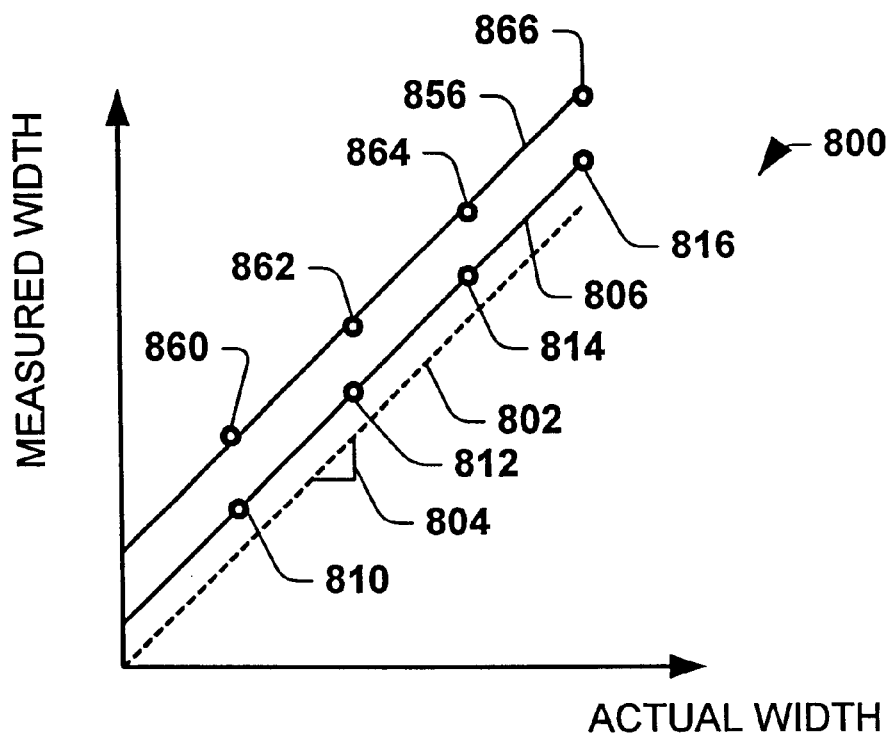
FIG. 15 is another exemplary graph illustrating a correlation of measured and actual width which may be used in the methods and systems of the present invention.

Referring now to FIG. 15, a graph 800 illustrates a correlation of actual and measured feature width obtained by measurements 810, 812, 814, and 816 via SEM scanning of line sets 370, 372, 374, and 376, respectively, of the reference sample 350 in FIG. 10. A correlation curve 806 has been constructed in accordance with the invention. At a later time, subsequent measurements 860, 862, 864, and 866 are obtained of the same lines sets 370, 372, 374, and 376. A correlation curve 856 is illustrated for this second measurement of the reference features, which may be used by the processing system 144 to obtain one or more calibration factors (not shown) for the SEM system 100, as discussed supra. The system 144 may further perform trending analysis of the previous and subsequent curves 806 and 856, respectively. In this example, the system 144 may indicate the change over time to a user, may make adjustments in the SEM system 100 based thereon, may correlate this trending information with other reference sample feature measurements using, for example, data fusion techniques, and/or may take other appropriate actions.

Many different correlations are possible, all of which are not illustrated herein. However, it will be appreciated that a wide variety of correlation techniques are within the scope of the invention, comprising one or more of computing the slope of a curve, computing a zero offset, computing a calibration coefficient, curve fitting, stochastics, neural networks, artificial intelligence, data fusion techniques, and/or trending. In addition, many different correlations are possible, based on measurements of features on different reference samples, some of which are illustrated in FIGS. 4–10.

Although the invention has been shown and described with respect to a certain embodiments, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary embodiments of the invention. In this regard, it will also be recognized that the invention includes a system for performing the steps of the various methods of the invention.

In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising."

What is claimed is:

1. A method for calibrating a scanning electron microscope, comprising:

providing a reference sample having a first line with a first line width, and a second line with a second line width;

measuring the first line width using the scanning electron microscope;

measuring the second line width using the scanning electron microscope; and correlating the first line width measurement with the second line width measurement to obtain at least one calibration factor.

2. The method of claim 1, further comprising:

measuring a workpiece feature using the scanning electron microscope to obtain a workpiece feature measurement; and correlating the workpiece feature measurement with the at least one calibration factor to obtain a workpiece feature critical dimension (CD).

3. The method of claim 1, wherein correlating the first line width measurement with the second line width measurement to obtain at least one calibration factor comprises at least one of computing the slope of a curve, computing a calibration coefficient, curve fitting, stochastics, neural networks, artificial intelligence, data fusion techniques, and trending.

4. A method for calibrating a scanning electron microscope, comprising:

providing a reference sample having a first line set with generally parallel lines of a first pitch, and a second line set with generally parallel lines of a second pitch;

measuring the first pitch using the scanning electron microscope;

measuring the second pitch using the scanning electron microscope; and correlating the first pitch measurement with the second pitch measurement to obtain at least one calibration factor.

5. The method of claim 4, further comprising:

measuring a workpiece feature using the scanning electron microscope to obtain a workpiece feature measurement; and correlating the workpiece feature measurement with the at least one calibration factor to obtain a workpiece feature critical dimension (CD).

6. The method of claim 5, wherein correlating the workpiece feature measurement with the at least one calibration factor to obtain a workpiece feature critical dimension (CD) comprises at least one of computing the slope of a curve, computing a calibration coefficient, curve fitting, stochastics, neural networks, artificial intelligence, data fusion techniques, and trending.

7. The method of claim 6, wherein correlating the first pitch measurement with the second pitch measurement to obtain at least one calibration factor comprises at least one of computing the slope of a curve, computing a calibration coefficient, curve fitting, stochastics, neural networks, artificial intelligence, data fusion techniques, and trending.

8. The method of claim 4, wherein correlating the first pitch measurement with the second pitch measurement to obtain at least one calibration factor comprises at least one of computing the slope of a curve, computing a calibration coefficient, curve fitting, stochastics, neural networks, artificial intelligence, data fusion techniques, and trending.

9. A method for calibrating a scanning electron microscope, comprising:

providing a reference sample having a first line set with generally parallel lines of a first line width and a first pitch, and a second line set with generally parallel lines of a second line width and a second pitch;

measuring at least one of the first line width and the first pitch using the scanning electron microscope;

measuring at least one of the second line width and the second pitch using the scanning electron microscope; and correlating at least one of the first line width measurement and the first pitch measurement with at least one of the second line width measurement and the second pitch measurement to obtain at least one calibration factor.

10. The method of claim 9, wherein correlating at least one of the first line width measurement and the first pitch measurement with at least one of the second line width measurement and the second pitch measurement to obtain at least one calibration factor comprises at least one of computing the slope of a curve, computing a calibration coefficient, curve fitting, stochastics, neural networks, artificial intelligence, data fusion techniques, and trending.

11. The method of claim 9, further comprising:

measuring a workpiece feature using the scanning electron microscope to obtain a workpiece feature measurement; and correlating the workpiece feature measurement with the at least one calibration factor to obtain a workpiece feature critical dimension (CD).

12. The method of claim 11, wherein correlating at least one of the first line width measurement and the first pitch measurement with at least one of the second line width measurement and the second pitch measurement to obtain at least one calibration factor comprises computing a slope of a curve connecting at least one of the first line width measurement and the first pitch measurement with at least one of the second line width measurement and the second pitch measurement to obtain a calibration zero factor and a calibration span factor.

13. The method of claim 9, wherein correlating at least one of the first line width measurement and the first pitch measurement with at least one of the second line width measurement and the second pitch measurement to obtain at least one calibration factor comprises computing a slope of a curve connecting at least one of the first line width measurement and the first pitch measurement with at least one of the second line width measurement and the second pitch measurement to obtain a calibration zero factor and a calibration span factor.

14. A system for calibrating a scanning electron microscope, comprising:

a reference sample having a first line set with generally parallel lines of a first line width and a first pitch, and a second line set with generally parallel lines of a second line width and a second pitch;

a scanning electron microscope for measuring at least one of the first line width and the first pitch, and at least one of the second line width and the second pitch; and a processor for correlating at least one of the first line width measurement and the first pitch measurement with at least one of the second line width measurement and the second pitch measurement to obtain at least one calibration factor.

15. The system of claim 14, wherein the processor further correlates a workpiece feature measurement with the at least one calibration factor in order to obtain a workpiece feature critical dimension (CD).

16. The system of claim 14, wherein the processor correlates the at least one of the first line width measurement and the first pitch measurement with at least one of the second line width measurement and the second pitch measurement to obtain at least one calibration factor via at least one of computing the slope of a curve, computing a calibration coefficient, curve fitting, stochastics, neural networks, artificial intelligence, data fusion techniques, and trending.

17. A system for calibrating a scanning electron microscope, comprising:

a reference sample having a first line set with generally parallel lines of a first line width and a first pitch, and a second line set with generally parallel lines of a second line width and a second pitch;

means for measuring at least one of the first line width and the first pitch;

means for measuring at least one of the second line width and the second pitch; and means for correlating at least one of the first line width measurement and the first pitch measurement with at lest one of the second line width measurement and the second pitch measurement to obtain at least one calibration factor.

18. The system of claim 17, further comprising means for correlating a workpiece feature measurement with the at least one calibration factor to obtain a workpiece feature critical dimension (CD).

19. The system of claim 18, wherein the means for correlating a workpiece feature measurement with the at least one calibration factor to obtain a workpiece feature critical dimension (CD) comprises at least one of computing the slope of a curve, computing a calibration coefficient, curve fitting, stochastics, neural networks, artificial intelligence, data fusion techniques, and trending.

20. The system of claim 17, wherein the means for correlating at least one of the first line width measurement and the first pitch measurement with at least one of the second line width measurement and the second pitch measurement to obtain at least one calibration factor comprises at least one of computing the slope of a curve, computing a calibration coefficient, curve fitting, stochastics, neural networks, artificial intelligence, data fusion techniques, and trending.

\* \* \* \* \*